US010848119B2

(12) United States Patent
Oide et al.

(10) Patent No.: US 10,848,119 B2
(45) Date of Patent: Nov. 24, 2020

(54) ELECTRONIC COMPONENT

(71) Applicant: TDK CORPORATION, Tokyo (JP)

(72) Inventors: Akihiko Oide, Tokyo (JP); Yoji Tozawa, Tokyo (JP); Seiichi Nakagawa, Tokyo (JP); Shinichi Kondo, Tokyo (JP); Takashi Endo, Tokyo (JP); Makoto Yoshino, Tokyo (JP); Noriaki Hamachi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/160,489

(22) Filed: Oct. 15, 2018

(65) Prior Publication Data

US 2019/0123705 A1 Apr. 25, 2019

(30) Foreign Application Priority Data

Oct. 25, 2017 (JP) ................. 2017-206191

(51) Int. Cl.
| | |
|---|---|
| *H03H 7/01* | (2006.01) |
| *H01G 4/008* | (2006.01) |
| *H03H 1/00* | (2006.01) |
| *H01G 4/38* | (2006.01) |
| *H01G 4/40* | (2006.01) |

(Continued)

(52) U.S. Cl.
CPC ....... *H03H 7/0115* (2013.01); *H01F 17/0013* (2013.01); *H01F 27/2804* (2013.01); *H01F 27/29* (2013.01); *H01F 27/292* (2013.01); *H01F 27/32* (2013.01); *H01F 27/40* (2013.01); *H01G 4/0085* (2013.01); *H01G 4/228* (2013.01); *H01G 4/38* (2013.01); *H01G 4/40* (2013.01); *H03H 1/00* (2013.01); *H01F 2017/0026* (2013.01); *H01F 2027/2809* (2013.01); *H01G 4/1218* (2013.01); *H01G 4/1227* (2013.01); *H01G 4/1245* (2013.01); *H03H 2001/0057* (2013.01); *H03H 2001/0085* (2013.01)

(58) Field of Classification Search
CPC ......... H03H 2001/0085; H03H 7/0115; H03H 7/427
USPC ................................. 333/175, 185
See application file for complete search history.

(56) References Cited

U.S. PATENT DOCUMENTS 5,412,357 A * 5/1995 Nakamura ............... H03H 1/02
333/181
2016/0344181 A1* 11/2016 Matsunaga ............ H01G 4/005

FOREIGN PATENT DOCUMENTS

JP 2009-212229 A 9/2009

* cited by examiner

*Primary Examiner* — Rakesh B Patel
(74) *Attorney, Agent, or Firm* — Oliff PLC

(57) ABSTRACT

An element body includes a first function portion including a first material, a second function portion including a second material different from the first material, and an intermediate portion placed between the first function portion and the second function portion. The intermediate portion includes a first component included in the first material, and a second component included in the second material. A side surface of the element body includes surfaces of the first function portion, the second function portion, and the intermediate portion. Each of terminal electrodes includes electrode portion formed on the side surface across the surfaces of the first function portion, the second function portion, and the intermediate portion. An insulating layer is formed on the side surface in such a manner as to be in contact with at least a region exposed from the electrode portions between the electrode portions in the surface of the intermediate portion.

8 Claims, 10 Drawing Sheets

(51) Int. Cl.
*H01F 27/28* (2006.01)
*H01F 27/29* (2006.01)
*H01F 27/32* (2006.01)
*H01F 27/40* (2006.01)
*H01G 4/228* (2006.01)
*H01F 17/00* (2006.01)
H01G 4/12 (2006.01)

ELECTRONIC COMPONENT

BACKGROUND OF THE INVENTION

1. Field of the Invention

The present invention relates to an electric component.

2. Description of Related Art

Known electronic components include an element body including a side surface, and a plurality of terminal electrodes disposed on the element body (see, for example, Japanese Unexamined Patent Publication No. 2009-212229). The element body includes a first function portion including a first material, a second function portion including a second material different from the first material, and an intermediate portion placed between the first function portion and the second function portion. The intermediate portion includes a first component included in the first material, and a second component that is included in the second material and that is different from the first component. The side surface includes surfaces of the first function portion, the second function portion, and the intermediate portion. Each of the plurality of terminal electrodes includes electrode portion formed on the side surface across the surfaces of the first function portion, the second function portion, and the intermediate portion. The intermediate portion reduces an internal stress generated due to a difference between contraction rates of the first function portion and the second function portion in a manufacturing process (such as firing process) of the electronic component.

SUMMARY OF THE INVENTION

In a case in which the element body includes the intermediate portion, the following problem may be generated. For example, the first component included in the intermediate portion is diffused to the first function portion and the second component included in the intermediate portion is diffused to the second function portion in the firing process. In a case in which the first component and the second component are diffused from the intermediate portion, a structure of the intermediate portion becomes coarse. In a case in which the structure of the intermediate portion is coarse, migration may occur between the electrode portions through the intermediate portion.

An object of one aspect of the present invention is to provide an electronic component that controls occurrence of migration.

An electronic component according to one aspect includes an element body including a side surface, a plurality of terminal electrodes disposed on the element body, and an insulating layer disposed on the element body. The element body includes a first function portion including a first material, a second function portion including a second material different from the first material, and an intermediate portion placed between the first function portion and the second function portion. The intermediate portion includes a first component included in the first material, and a second component that is included in the second material and that is different from the first component. The side surface includes surfaces of the first function portion, the second function portion, and the intermediate portion. Each of the plurality of terminal electrodes includes electrode portion formed on the side surface across the surfaces of the first function portion, the second function portion, and the intermediate portion. The insulating layer is formed on the side surface in such a manner as to be in contact with at least a region exposed from the electrode portions between the electrode portions in the surface of the intermediate portion.

In the one aspect, the insulating layer formed on the side surface is in contact with the region exposed from the electrode portions between the electrode portions in the surface of the intermediate portion. Therefore, migration tends not to occur through the intermediate portion. Consequently, the one aspect controls occurrence of migration.

In the one aspect, the insulating layer may be formed on the whole side surface in such a manner as to be in contact with the electrode portions and a region exposed from the electrode portions in the surfaces of the first function portion, the second function portion, and the intermediate portion. This configuration reliably controls occurrence of migration.

In the one aspect, each of the electrode portions may include a sintered metal layer formed on the side surface. The insulating layer may be formed in such a manner as to be in contact with the sintered metal layers. In a case in which an internal conductor of which an end is exposed to the side surface is disposed in the element body, the end of the internal conductor is connected to the sintered metal layer. In a case in which a position where the sintered metal layer is formed is deviated from an intended position, the end of the internal conductor may be exposed from the sintered metal layer. In a case in which the end of the internal conductor is exposed from the sintered metal layer, moisture may infiltrate into the element body through a space between the end of the internal conductor and the element body. In a case in which moisture infiltrates into the element body, a characteristic of the electronic component may be deteriorated. In a configuration in which the insulating layer is formed in such a manner as to be in contact with the sintered metal layer, the end of the internal conductor is covered with the insulating layer. Therefore, the insulating layer controls infiltration of moisture into the element body.

In the one aspect, the insulating layer may include insulating glass. This configuration easily controls occurrence of migration.

In the one aspect, insulation resistance of the intermediate portion may be lower than insulation resistance of each of the first function portion and the second function portion. In a case in which the insulation resistance of the intermediate portion is lower than the insulation resistance of each of the first function portion and the second function portion, migration tends to occur. However, even in this case, occurrence of migration is controlled between the electrode portions.

In the one aspect, the plurality of terminal electrodes may have a potential difference. In a case in which the plurality of terminal electrodes has a potential difference, migration tends to occur. However, even in this case, occurrence of migration is controlled between the electrode portions.

In the one aspect may include a first inductor and a second inductor disposed in the first function portion, and a first capacitor and a second capacitor disposed in the second function portion may be included. The first capacitor and the first inductor may configure a filter. The second capacitor and the second inductor may configure a filter. The first material may include a ferrite material and the second material may include a dielectric ceramic material. The plurality of terminal electrodes may include a first input terminal electrode and a first output terminal electrode to which the first inductor is connected, and a second input terminal electrode and a second output terminal electrode to which the second inductor is connected. This configuration achieves an LC filter array that controls occurrence of migration.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
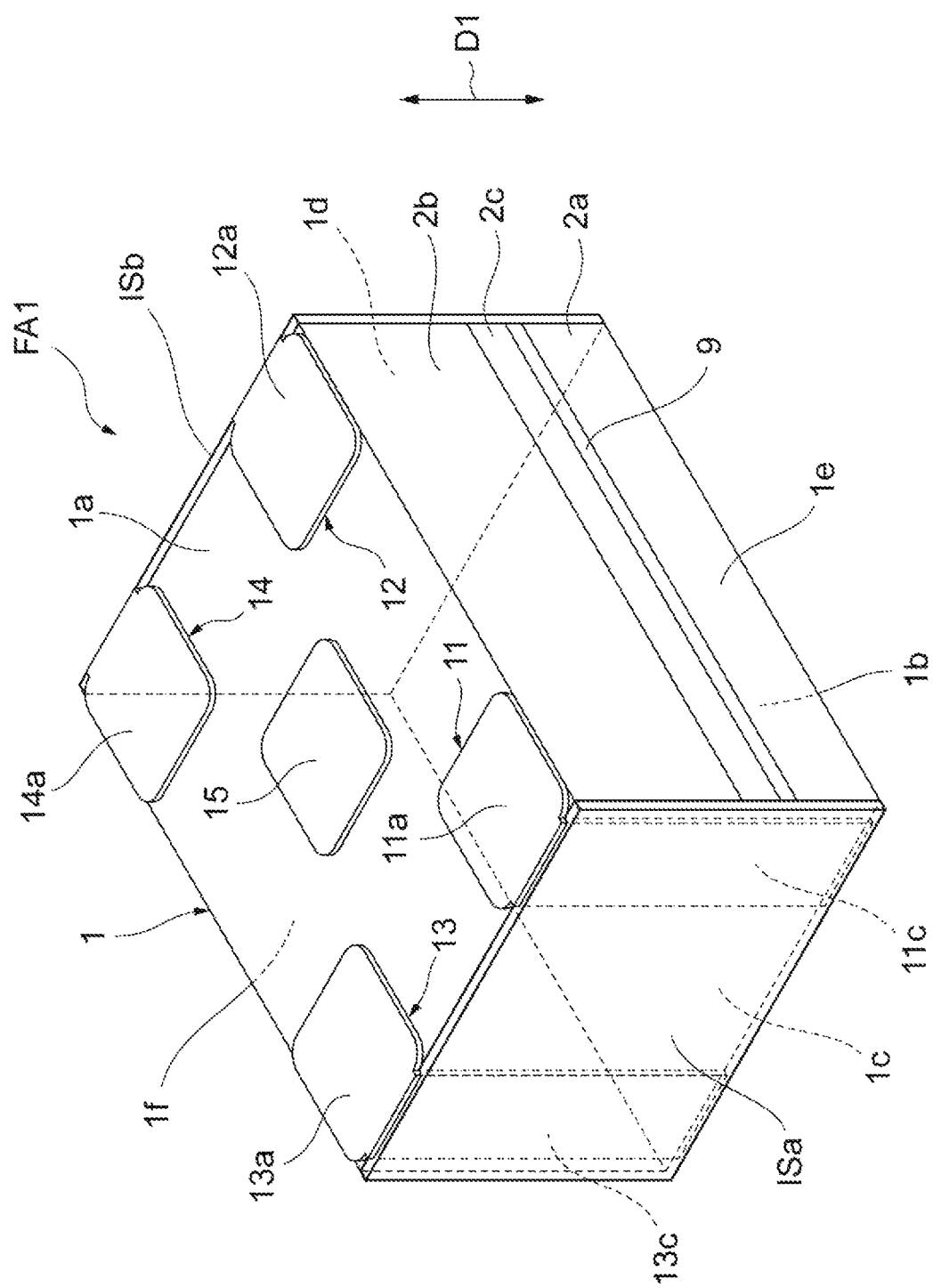
FIG. 1 is a perspective view illustrating a multilayer LC filter array according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
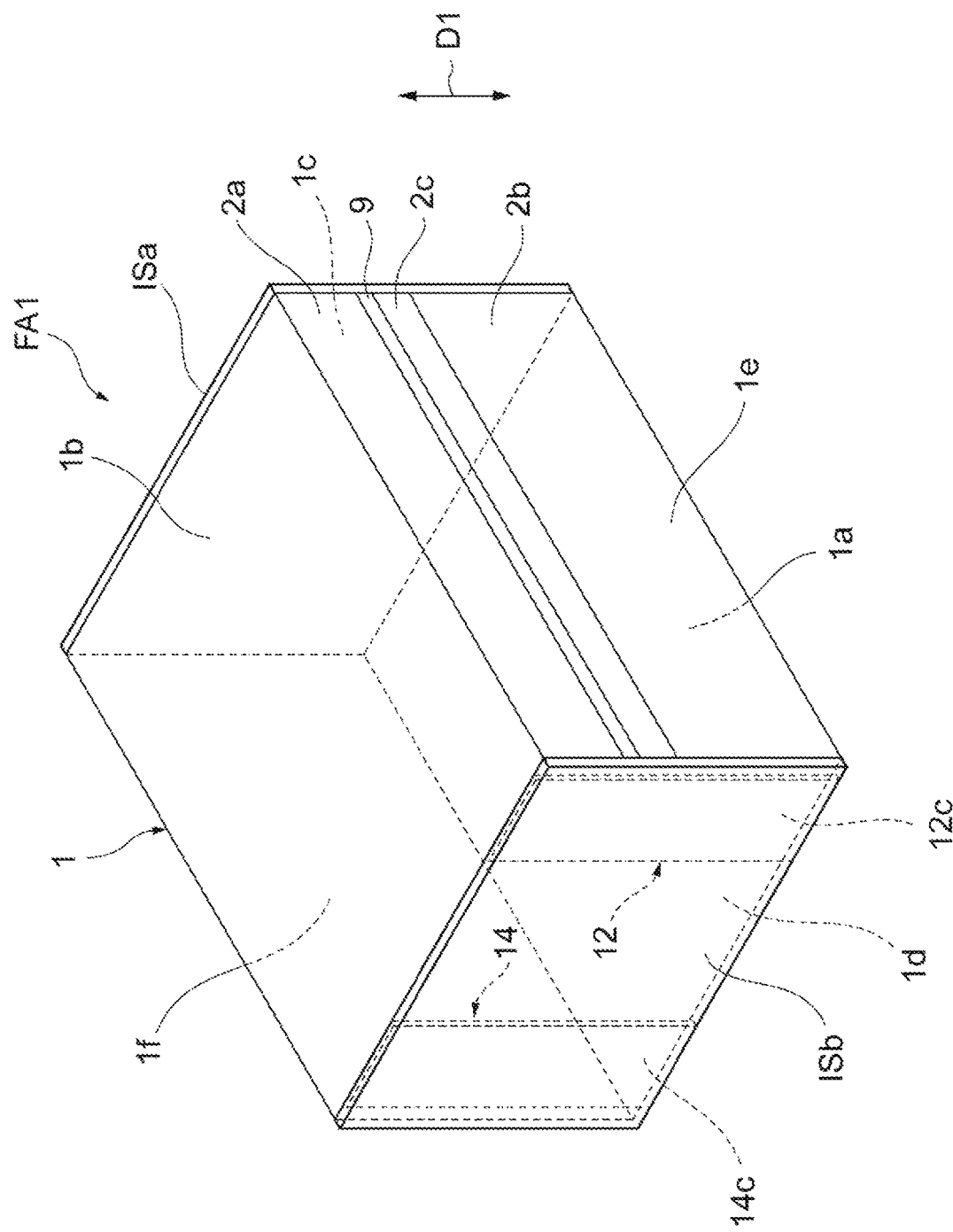
FIG. 2 is a perspective view illustrating the multilayer LC filter array according to the embodiment.
Figure 3:
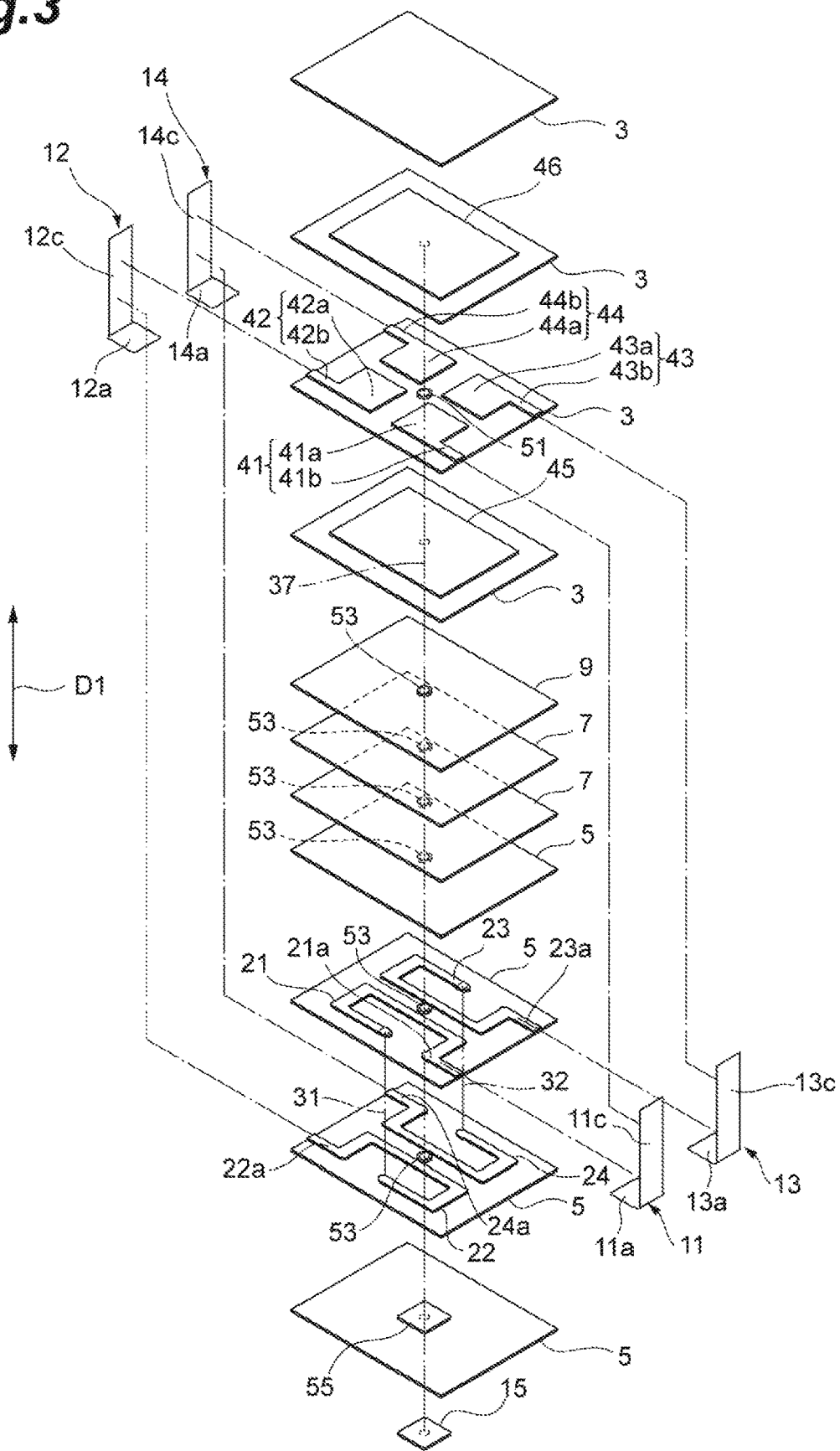
FIG. 3 is an exploded perspective view illustrating a configuration of the multilayer LC filter array according to the embodiment.
Figure 4:
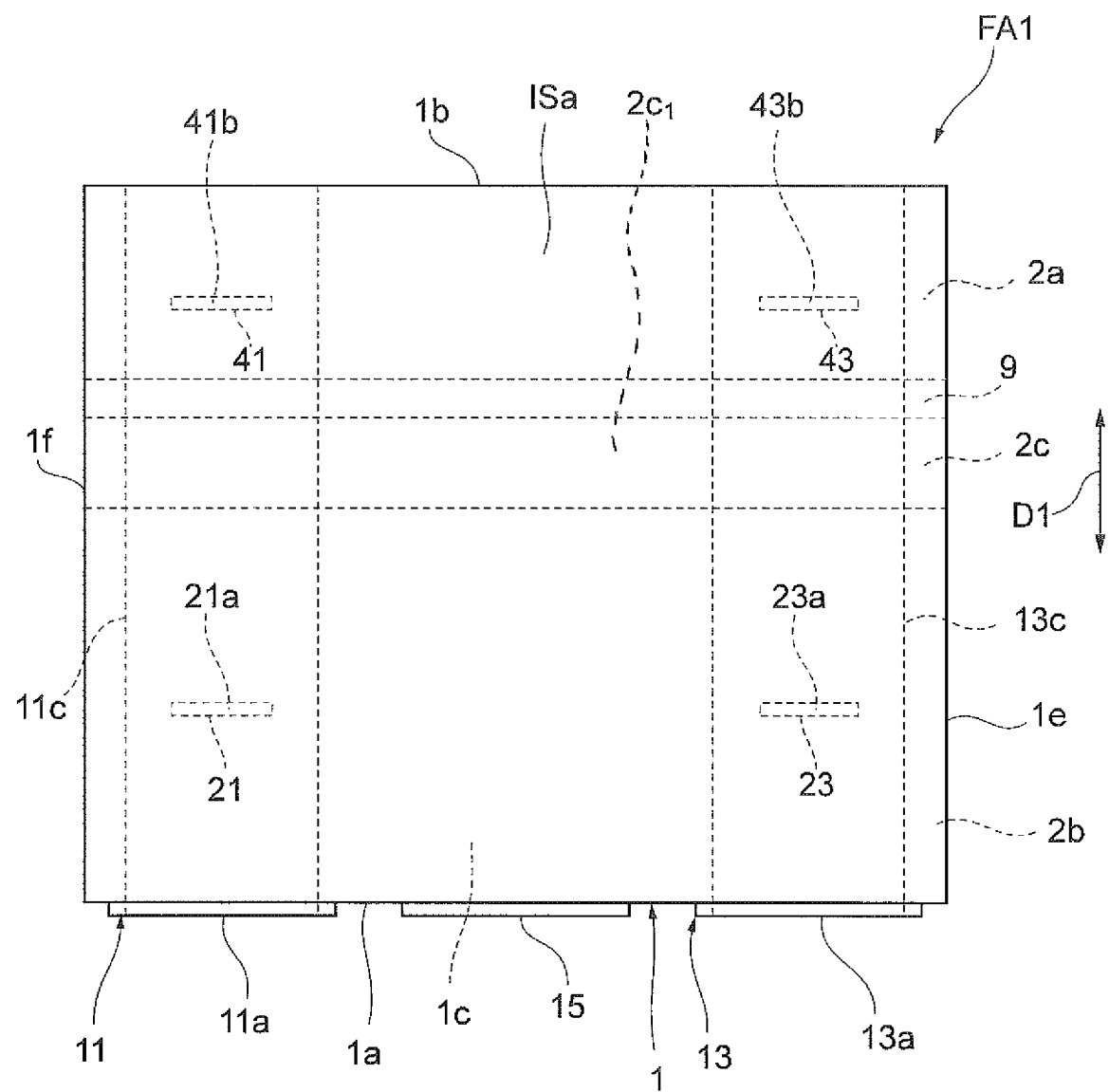
FIG. 4 is a side view illustrating the multilayer LC filter array according to the embodiment.
Figure 5:
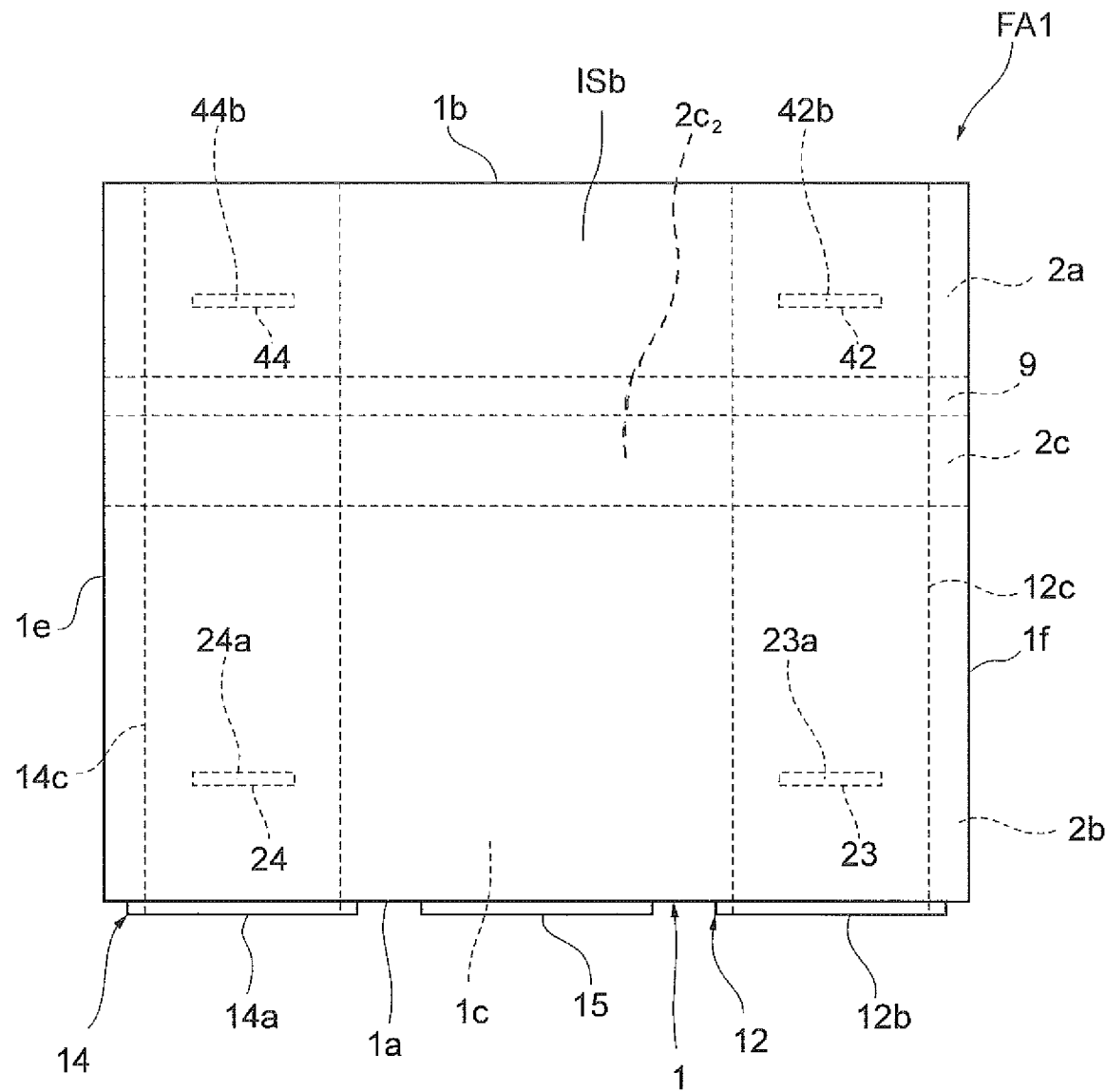
FIG. 5 is a side view illustrating the multilayer LC filter array according to the embodiment.
Figure 6:
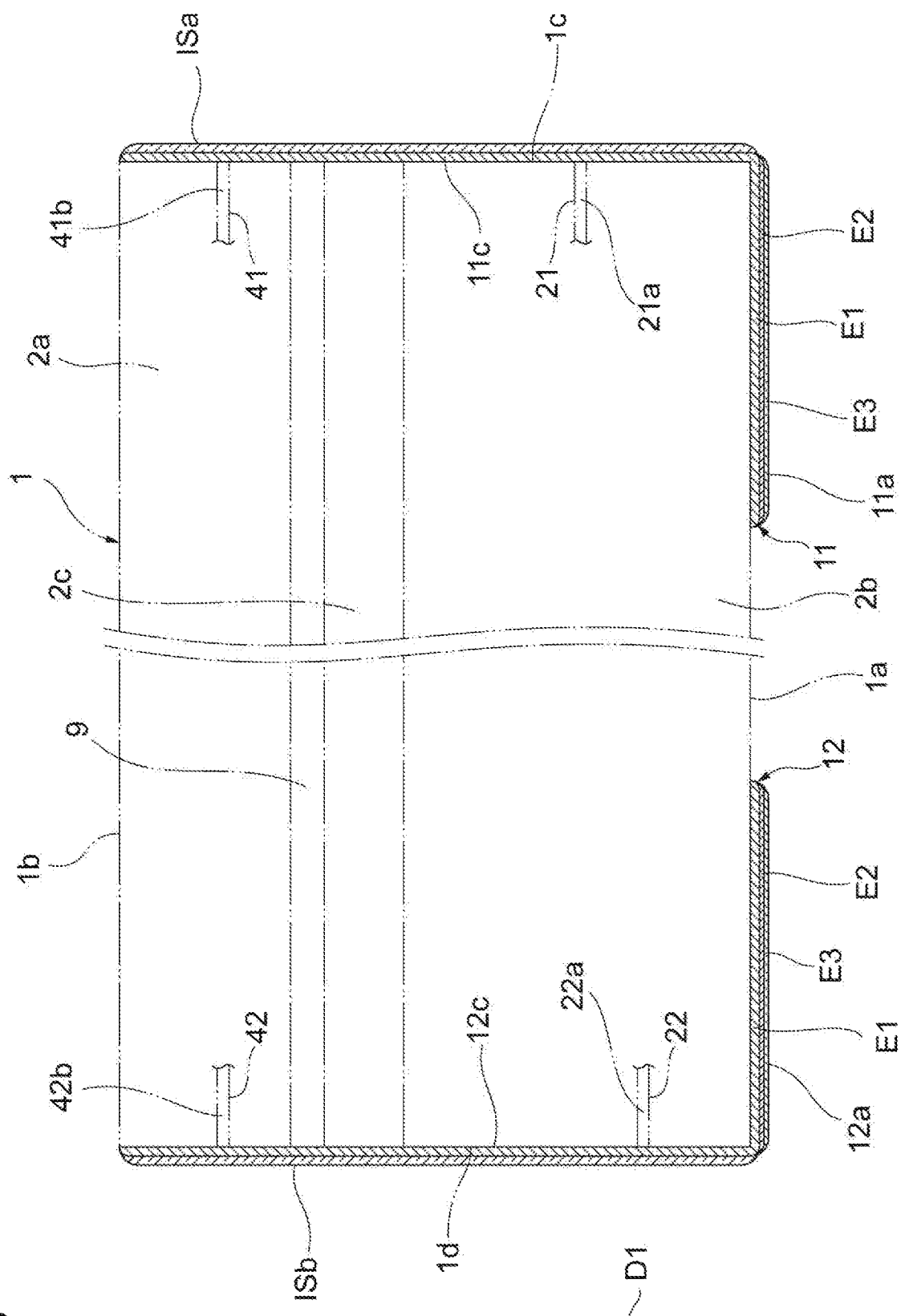
FIG. 6 is a view illustrating a cross-sectional configuration of a terminal electrode and an insulating layer.
Figure 7:
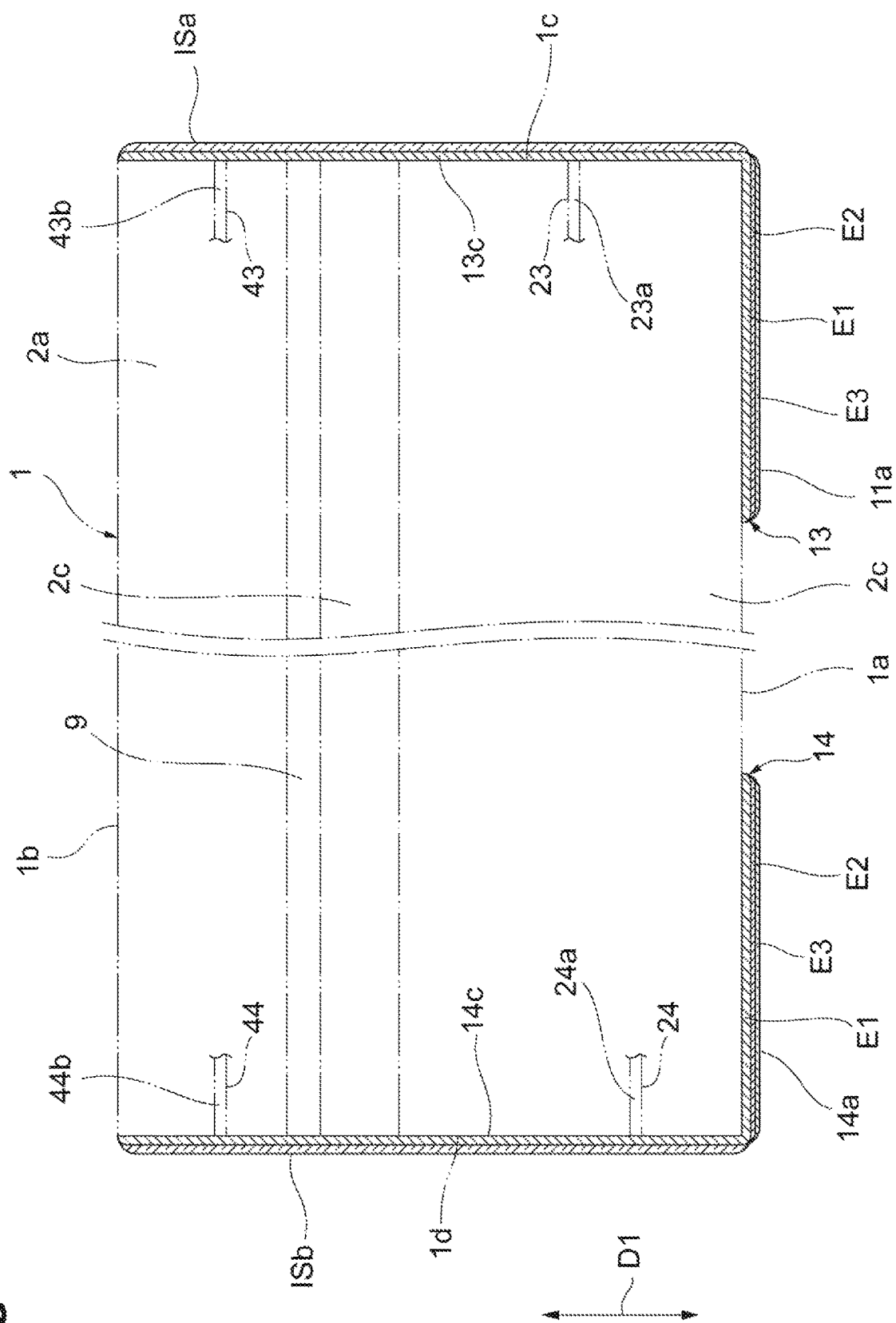
FIG. 7 is a view illustrating a cross-sectional configuration of the terminal electrode and the insulating layer.

A configuration of a multilayer LC filter array FA1 according to an embodiment will be described with reference to FIG. 1 to FIG. 7. FIG. 1 and FIG. 2 are perspective views illustrating the multilayer LC filter array according to the present embodiment. FIG. 3 is an exploded perspective view illustrating a configuration of the multilayer LC filter array according to the present embodiment. FIG. 4 and FIG. 5 are side views illustrating the multilayer LC filter array according to the present embodiment. FIG. 6 and FIG. 7 are views illustrating a cross-sectional configuration of a terminal electrode and an insulating layer. An electronic component is, for example, the multilayer LC filter array FA1 in the present embodiment. In the following, the multilayer LC filter array FA1 will be called a "filter array FA1."

As illustrated in FIG. 1 and FIG. 2, the filter array FA1 includes an element body 1, and a plurality of terminal electrodes 11, 12, 13, 14, and 15. The plurality of terminal electrodes 11, 12, 13, 14, and 15 is disposed on an outer surface of the element body 1. For example, the terminal electrodes 11 and 13 function as input terminal electrodes, the terminal electrodes 12 and 14 function as output terminal electrodes, and the terminal electrode 15 functions as a ground terminal electrode. Each of the terminal electrodes 11, 12, 13, 14, and 15 includes an electrical conducting material. The electrical conducting material includes, for example, Ag or Pd. For example, in a case in which the terminal electrode 11 constitutes a first input terminal electrode, the terminal electrode 12 constitutes a first output terminal electrode. For example, in a case in which the terminal electrode 13 constitutes a second input terminal electrode, the terminal electrode 14 constitutes a second output terminal electrode.

The filter array FA1 is mounted on an electronic device. The electronic device includes, for example, a circuit board or an electronic component. Each of the terminal electrodes 11, 12, 13, and 14 is connected to a corresponding signal line. The terminal electrode 15 is grounded. For example, the filter array FA1 is solder-mounted on the electronic device.

The element body 1 has a rectangular parallelepiped shape. The element body 1 includes a first principal surface 1a and a second principal surface 1b opposing each other, a first side surface 1c and a second side surface 1d opposing each other, and a third side surface 1e and a fourth side surface 1f opposing each other. Each of the first principal surface 1a and the second principal surface 1b has a rectangular shape. In the filter array FA1, the first principal surface 1a is a mounting surface opposing the electronic device. The first principal surface 1a is arranged to constitute the mounting surface. The rectangular parallelepiped shape includes a rectangular parallelepiped shape in which corners and ridges are chamfered, and a rectangular parallelepiped shape in which the corners and ridges are rounded.

The first side surface 1c and the second side surface 1d extend in a first direction D1 in which the first principal surface 1a and the second principal surface 1b oppose each other in such a manner as to couple the first principal surface 1a and the second principal surface 1b. The first side surface 1c and the second side surface 1d also extend in a direction in which the third side surface 1e and the fourth side surface 1f oppose each other. The third side surface 1e and the fourth side surface 1f extend in the first direction D1 in such a manner as to couple the first principal surface 1a and the second principal surface 1b. The third side surface 1e and the fourth side surface 1f also extend in a direction in which the first side surface 1c and the second side surface 1d oppose each other. The first direction D1 is a direction orthogonal to the first principal surface 1a.

The element body 1 is configured by laminating of a plurality of insulator layers 3, 5, 7, and 9 in the first direction D1. The element body 1 includes the plurality of insulator layers 3, 5, 7, and 9 laminated in the first direction D1. In the element body 1, a direction in which the plurality of insulator layers 3, 5, 7, and 9 is laminated coincides with the first direction D1. In an actual element body 1, the insulator layers 3, 5, 7, and 9 are integrated to such an extent that a boundary between the insulator layers 3, 5, 7, and 9 cannot be visually recognized.

The element body 1 includes a function portion 2a including the plurality of insulator layers 3, a function portion 2b including the plurality of insulator layers 5, and an intermediate portion 2c including the plurality of insulator layers 7. The intermediate portion 2c is placed between the function portion 2a and the function portion 2b. The insulator layer 9 is placed between the function portion 2a and the intermediate portion 2c. In the present embodiment, the insulator layer 9 is in contact with the function portion 2a and the intermediate portion 2c. The intermediate portion 2c is in contact with the insulator layers 5. The first side surface 1c, the second side surface 1d, the third side surface 1e, and the fourth side surface 1f include surfaces of the function portion 2a, the function portion 2b, and the intermediate portion 2c. The first principal surface 1a includes a surface of the function portion 2b. The second principal surface 1b includes a surface of the function portion 2a. For example, in a case in which the function portion 2b constitutes a first function portion, the function portion 2a constitutes a second function portion.

Each of the insulator layers 3 includes, for example, a sintered body of a ceramic green sheet including a dielectric material. The dielectric material is, for example, a $BaTiO_3$-based, $Ba(Ti,Zr)O_3$-based, $(Ba,Ca)TiO_3$-based, $SrTiO_3$-based, $CaTiO_3$-based, $(Ba,Sr)TiO_3$-based, $(Ba,Sr)(Ti,Zr)O_3$-based, $(Ba,Sr,Ca)TiO_3$-based, $(Ba,Sr,Ca)(Ti,Zr)O_3$-based, $TiO_2$-based, $Zn_2TiO_4$-based, $ZnTiO_3$-based, or $TiO_2$—$BaO$—$Nd_2O_3$-based dielectric ceramic material. In the present embodiment, each of the insulator layers 3 is made of the dielectric material.

Each of the insulator layers 5 includes, for example, a sintered body of a ceramic green sheet including a magnetic material. The magnetic material is, for example, an Ni—Cu—Zn-based ferrite material, an Ni—Cu—Zn—Mg-based ferrite material, or an Ni—Cu-based ferrite material. In the present embodiment, each of the insulator layers 5 is made of a magnetic material (ferrite material). Each of the insulator layers 5 may include a sintered body of a ceramic green sheet including a non-magnetic material. The non-magnetic material is, for example, a Cu—Zn-based ferrite material, a dielectric material, or a glass ceramic material. Each of the insulator layers 5 may be made of a non-magnetic material.

Each of the insulator layers 7 includes, for example, a sintered body of a ceramic green sheet including a component included in a dielectric material and a component included in a magnetic material. In the present embodiment, each of the insulator layers 7 includes $TiO_2$ as a component included in the dielectric material. Each of the insulator layers 7 includes NiO as a component included in the magnetic material. In a case in which each of the insulator layers 5 includes a non-magnetic material, each of the insulator layers 7 includes a component included in the dielectric material and a component included in the non-magnetic material, for example. The intermediate portion 2c including the insulator layers 7 reduces an internal stress generated due to a difference between contraction rates of the function portion 2a and the function portion 2b in a manufacturing process (such as firing process) of the filter array FA1. Ti included in the intermediate portion 2c is diffused to the function portion 2a and Ni included in the intermediate portion 2c is diffused to the function portion 2b. Therefore, a structure of the intermediate portion 2c is coarse, as compared with those of the function portions 2a and 2b, and insulation resistance of the intermediate portion 2c is lower than insulation resistance of each of the function portions 2a and 2b.

The insulator layer 9 includes, for example, a sintered body of a ceramic green sheet including a Cu—Zn-based ferrite material or a dielectric material. The dielectric material is, for example, a $Zn_2TiO_4$-based, $ZnTiO_3$-based, $TiO_2$-based, $BaO$—$TiO_2$-based, or $ZnO$—$BaO$—$TiO_2$-based dielectric ceramic material. In the present embodiment, the insulator layer 9 includes a ($Zn_2TiO_4$-based) dielectric material. The insulator layer 9 controls movement of specific metal (atom) from the function portion 2b to the function portion 2a. In the present embodiment, the insulator layer 9 controls movement of Fe included in the function portion 2b.

The terminal electrodes 11 and 13 are disposed on the first side surface 1c. The terminal electrode 11 is disposed at a corner defined by the first side surface 1c and the third side surface 1e. The terminal electrode 13 is disposed at a corner defined by the first side surface 1c and the fourth side surface 1f. The terminal electrode 11 includes an electrode portion 11a disposed on the first principal surface 1a, and an electrode portion 11c disposed on the first side surface 1c. The terminal electrode 13 includes an electrode portion 13a disposed on the first principal surface 1a, and an electrode portion 13c disposed on the first side surface 1c. The electrode portions 11a and 11c are formed integrally. The electrode portions 13a and 13c are formed integrally.

The terminal electrodes 12 and 14 are disposed on the second side surface 1d. The terminal electrode 12 is disposed at a corner defined by the second side surface 1d and the third side surface 1e. The terminal electrode 14 is disposed at a corner defined by the second side surface 1d and the fourth side surface 1f. The terminal electrode 12 includes an electrode portion 12a disposed on the first principal surface 1a, and an electrode portion 12c disposed on the second side surface 1d. The terminal electrode 14 includes an electrode portion 14a disposed on the first principal surface 1a, and an electrode portion 14c disposed on the second side surface 1d. The electrode portions 12a and 12c are formed integrally. The electrode portions 14a and 14c are formed integrally.

The terminal electrode 15 is disposed at a center of the first principal surface 1a when viewed from the first direction D1. The terminal electrode 15 includes an electrode portion disposed on the first principal surface 1a. The electrode portions 11a, 12a, 13a, and 14a of the terminal electrodes 11, 12, 13, and 14 are respectively disposed at different corners of the first principal surface 1a, that is, different corners of the element body 1 when viewed from the first direction D1. The terminal electrode 15 is placed on an inner side of the electrode portions 11a, 12a, 13a, and 14a when viewed from the first direction D1.

As illustrated in FIG. 6 and FIG. 7, each of the terminal electrodes 11, 12, 13, 14, and 15 includes a first electrode layer E1, a second electrode layer E2, and a third electrode layer E3. The third electrode layer E3 configures an outermost layer of each of the terminal electrodes 11, 12, 13, 14, and 15. Each of the electrode portions 11a, 12a, 13a, and 14a includes a first electrode layer E1, a second electrode layer E2, and a third electrode layer E3. Each of the electrode portions 11a, 12a, 13a, and 14a is three-layered. Each of the electrode portions 11c, 12c, 13c, and 14c includes a first electrode layer E1. Each of the electrode portions 11c, 12c, 13c, and 14c is one-layered.

The first electrode layer E1 is formed by sintering conductive paste applied onto the surface of the element body 1. The first electrode layer E1 is formed by sintering a metal component (metal powder) contained in the conductive paste. The first electrode layer E1 is a sintered metal layer formed on the element body 1. In the present embodiment, the first electrode layer E1 is a sintered metal layer made of Ag. The first electrode layer E1 may be a sintered metal layer made of Pd or an Ag—Pd alloy. The first electrode layer E1 includes a noble metal. The conductive paste includes, for example, powder made of Ag, Pd, or an Ag—Pd alloy, a glass component, an organic binder, and an organic solvent.

The second electrode layer E2 is formed on the first electrode layer E1 by a plating method. In the present embodiment, the second electrode layer E2 is an Ni plated layer formed by Ni plating. The second electrode layer E2 may be an Sn plated layer, a Cu plated layer, or an Au plated layer. The third electrode layer E3 is formed on the second electrode layer E2 by a plating method. In the present embodiment, the third electrode layer E3 is an Sn plated layer formed by Sn plating. The third electrode layer E3 may be a Cu plated layer or an Au plated layer. The second electrode layer E2 and the third electrode layer E3 configure a plated layer formed on the first electrode layer E1. In the present embodiment, the plated layer formed on the first electrode layer E1 is two-layered.

The first electrode layers E1 included in the electrode portions 11a and 11c are formed integrally. The first electrode layers E1 included in the electrode portions 12a and 12c are formed integrally. The first electrode layers E1 included in the electrode portions 13a and 13c are formed integrally. The first electrode layers E1 included in the electrode portions 14a and 14c are also formed integrally.

The electrode portions 11c and 13c are formed on the first side surface 1c across the surfaces of the function portion 2a, the function portion 2b, and the intermediate portion 2c. Each of the electrode portions 11c and 13c includes the first electrode layer E1 formed on the first side surface 1c. The first electrode layer E1 included in each of the electrode portions 11c and 13c is in contact with the surfaces of the function portion 2a, the function portion 2b, and the intermediate portion 2c. The electrode portions 12c and 14c are formed on the second side surface 1d across the surfaces of the function portion 2a, the function portion 2b, and the intermediate portion 2c. Each of the electrode portions 12c and 14c includes the first electrode layer E1 formed on the second side surface 1d. The first electrode layer E1 included in each of the electrode portions 12c and 14c is in contact with the surfaces of the function portion 2a, the function portion 2b, and the intermediate portion 2c.

As illustrated in FIG. 3, the filter array FA1 includes a plurality of coil conductors 21, 22, 23, and 24. Each of the coil conductors 21, 22, 23, and 24 has a substantially annular shape. In the present embodiment, each of the coil conductors 21, 22, 23, and 24 has a shape in which a conductor is wound approximately one turn in a rectangular shape. Each of the coil conductors 21, 22, 23, and 24 includes an electrical conducting material. The electrical conducting material is, for example, Ag or Pd. Each of the coil conductors 21, 22, 23, and 24 includes a sintered body of a conductive paste including a conductive material. The conductive material includes, for example, Ag powder or Pd powder.

The coil conductor 21 and the coil conductor 22 are disposed in different positions (layer) in the first direction D1. The coil conductor 21 and the coil conductor 22 are separated from each other in the first direction D1 with at least one insulator layer 5 therebetween. The coil conductor 22 is placed closer to the second principal surface 1b than the coil conductor 21 is. The coil conductor 21 and the coil conductor 22 include conductor portions overlapped with each other when viewed from the first direction D1. The coil conductor 21 includes a first end and a second end. The coil conductor 22 includes a first end and a second end.

The coil conductor 21 includes a connecting portion 21a at the first end. The connecting portion 21a is exposed to the first side surface 1c. The connecting portion 21a, that is, the coil conductor 21 is connected to the terminal electrode 11 (first electrode layer E1 of electrode portion 11c) at the first end exposed to the first side surface 1c. The coil conductor 22 includes a connecting portion 22a at the first end. The connecting portion 22a is exposed to the second side surface 1d. The connecting portion 22a, that is, the coil conductor 22 is connected to the terminal electrode 12 (first electrode layer E1 of electrode portion 12c) at the first end exposed to the second side surface 1d.

Figure 8:
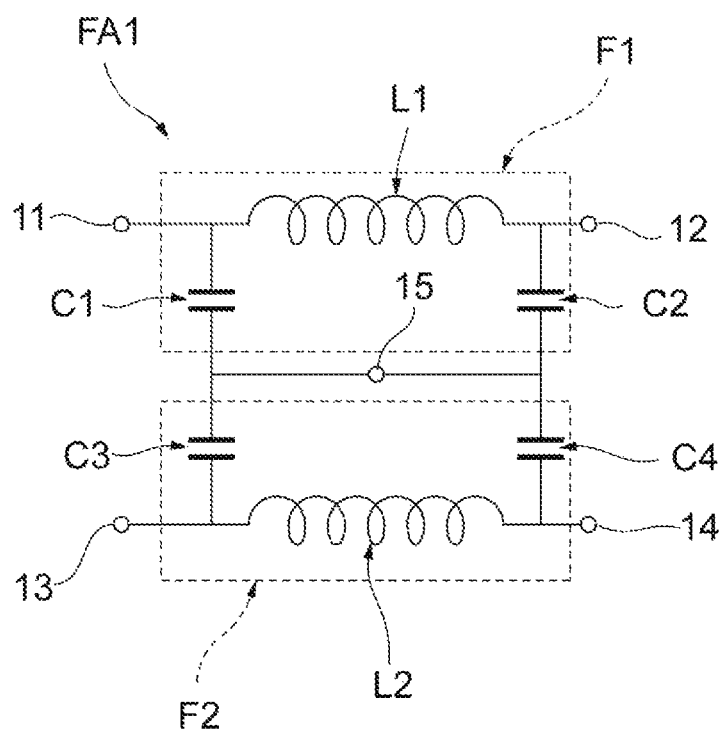
FIG. 8 is a view illustrating an equivalent circuit of the multilayer LC filter array according to the embodiment.

The second end of the coil conductor 21 and the second end of the coil conductor 22 are connected to each other by a through-hole conductor 31. The through-hole conductor 31 penetrates through the insulator layer 5 placed between the coil conductor 21 and the coil conductor 22. The coil conductor 21 and the coil conductor 22 are electrically connected to each other via the through-hole conductor 31. As illustrated in FIG. 8, the coil conductor 21 and the coil conductor 22 configure an inductor L1. The inductor L1 is connected to the terminal electrode 11 and the terminal electrode 12. FIG. 8 is a view illustrating an equivalent circuit of the multilayer LC filter array according to the embodiment.

The coil conductor 23 and the coil conductor 24 are disposed in different positions (layer) in the first direction D1. The coil conductor 23 and the coil conductor 24 are separated from each other in the first direction D1 with at least one insulator layer 5 therebetween. The coil conductor 24 is placed closer to the second principal surface 1b than the coil conductor 23 is. The coil conductor 23 and the coil conductor 24 include conductor portions overlapped with each other when viewed from the first direction D1. The coil conductor 23 includes a first end and a second end. The coil conductor 24 includes a first end and a second end.

The coil conductor 23 includes a connecting portion 23a at the first end. The connecting portion 23a is exposed to the first side surface 1c. The connecting portion 23a, that is, the coil conductor 23 is connected to the terminal electrode 13 (first electrode layer E1 of electrode portion 13c) at the first end exposed to the first side surface 1c. The coil conductor 24 includes a connecting portion 24a at the first end. The connecting portion 24a is exposed to the second side surface 1d. The connecting portion 24a, that is, the coil conductor 24 is connected to the terminal electrode 14 (first electrode layer E1 of electrode portion 14c) at the first end exposed to the second side surface 1d.

The second end of the coil conductor 23 and the second end of the coil conductor 24 are connected to each other by a through-hole conductor 32. The through-hole conductor 32 penetrates through the insulator layer 5 placed between the coil conductor 23 and the coil conductor 24. The coil conductor 23 and the coil conductor 24 are electrically connected to each other via the through-hole conductor 32. As illustrated in FIG. 8, the coil conductor 23 and the coil conductor 24 configure an inductor L2. The inductor L2 is connected to the terminal electrode 13 and the terminal electrode 14.

The coil conductor 21 and the coil conductor 23 are disposed in the same position (layer) in the first direction D1. The coil conductor 21 and the coil conductor 23 are separated from each other in a direction in which the third side surface 1e and the fourth side surface 1f oppose each other. The coil conductor 21 is placed closer to the third side surface 1e, and the coil conductor 23 is placed closer to the fourth side surface 1f. The coil conductor 22 and the coil conductor 24 are disposed in the same position (layer) in the first direction D1. The coil conductor 22 and the coil conductor 24 are separated from each other in the direction in which the third side surface 1e and the fourth side surface 1f oppose each other. The coil conductor 22 is placed closer to the third side surface 1e, and the coil conductor 24 is placed closer to the fourth side surface 1f.

As illustrated in FIG. 3, the filter array FA1 includes a plurality of internal electrodes 41, 42, 43, 44, 45, and 46. Each of the internal electrodes 41, 42, 43, 44, 45, and 46 includes an electrical conducting material. The electrical conducting material includes, for example, Ag or Pd. Each of the internal electrodes 41, 42, 43, 44, 45, and 46 includes a sintered body of a conductive paste including a conductive material. The conductive material includes, for example, Ag powder or Pd powder.

The internal electrode 41 includes a main electrode portion 41a opposing the internal electrodes 45 and 46, and a connecting portion 41b. The connecting portion 41b is exposed to the first side surface 1c. The connecting portion 41b is connected to the terminal electrode 11 (first electrode layer E1 of electrode portion 11c) at an end exposed to the first side surface 1c. The connecting portion 41b connects the main electrode portion 41a and the terminal electrode 11. The main electrode portion 41a and the connecting portion 41b are formed integrally.

The internal electrode 42 includes a main electrode portion 42a opposing the internal electrodes 45 and 46, and a connecting portion 42b. The connecting portion 42b is exposed to the second side surface 1d. The connecting portion 42b is connected to the terminal electrode 12 (first electrode layer E1 of electrode portion 12c) at an end exposed to the second side surface 1d. The connecting portion 42b connects the main electrode portion 42a and the terminal electrode 12. The main electrode portion 42a and the connecting portion 42b are formed integrally.

The internal electrode 43 includes a main electrode portion 43a opposing the internal electrodes 45 and 46, and a connecting portion 43b. The connecting portion 43b is exposed to the first side surface 1c. The connecting portion 43b is connected to the terminal electrode 13 (first electrode layer E1 of electrode portion 13c) at an end exposed to the first side surface 1c. The connecting portion 43b connects the main electrode portion 43a and the terminal electrode 13. The main electrode portion 43a and the connecting portion 43b are formed integrally.

The internal electrode 44 includes a main electrode portion 44a opposing the internal electrodes 45 and 46, and a connecting portion 44b. The connecting portion 44b is exposed to the second side surface 1d. The connecting portion 44b is connected to the terminal electrode 14 (first electrode layer E1 of electrode portion 14c) at an end exposed to the second side surface 1d. The connecting portion 44b connects the main electrode portion 44a and the terminal electrode 14. The main electrode portion 44a and the connecting portion 44b are formed integrally.

The internal electrodes 41, 42, 43, and 44 and the internal electrodes 45 and 46 are disposed in different positions (layer) in the first direction D1. The internal electrodes 41, 42, 43, and 44 are placed between the internal electrode 45 and the internal electrode 46 in the first direction D1. The main electrode portions 41a, 42a, 43a, and 44a of the internal electrodes 41, 42, 43, and 44 are separated from the internal electrode 45 in the first direction D1 with at least one insulator layer 5 therebetween. The main electrode portions 41a, 42a, 43a, and 44a of the internal electrodes 41, 42, 43, and 44 are separated from the internal electrode 46 in the first direction D1 with at least one insulator layer 5 therebetween. The main electrode portions 41a, 42a, 43a, and 44a of the internal electrodes 41, 42, 43, and 44 oppose the internal electrodes 45 and 46 in the first direction D1.

As illustrated in FIG. 8, the internal electrode 41 and the internal electrodes 45 and 46 configure a capacitor C1. As illustrated in FIG. 8, the internal electrode 42 and the internal electrodes 45 and 46 configure a capacitor C2. As illustrated in FIG. 8, the internal electrode 43 and the internal electrodes 45 and 46 configure a capacitor C3. As illustrated in FIG. 8, the internal electrode 44 and the internal electrodes 45 and 46 configure a capacitor C4.

Between the internal electrode 45 and the internal electrode 46, a pad conductor 51 is disposed in such a manner as to be overlapped with the internal electrode 45 and the internal electrode 46 when viewed from the first direction D1. The pad conductor 51 is separated from the internal electrodes 41, 42, 43, and 44 placed in the same layer with the pad conductor 51. The pad conductor 51 is separated from the internal electrode 45 in the first direction D1 with an insulator layer 3 therebetween. The pad conductor 51 is separated from the internal electrode 46 in the first direction D1 with an insulator layer 3 therebetween.

A plurality of pad conductors 53 and 55 is disposed between the internal electrode 45 and the terminal electrode 15 in such a manner as to be overlapped with the internal electrode 45 and the terminal electrode 15 when viewed from the first direction D1. In a case in which the pad conductors 53 are placed in the same layer with the coil conductors 21, 22, 23, and 24, the pad conductors 53 are separated from the coil conductors 21, 22, 23, and 24 placed in the same layer. The pad conductors 53 are separated from each other in the first direction D1 with corresponding insulator layers 3, 5, 7, and 9 therebetween. The pad conductor 55 is placed between a pad conductor 53 that is the closest to the first principal surface 1a, and the terminal electrode 15. The pad conductor 53 and the pad conductor 55 are separated from each other in the first direction D1 with the insulator layer 5 therebetween. The pad conductor 55 and the terminal electrode 15 are separated from each other in the first direction D1 with the insulator layer 5 therebetween.

The internal electrodes 45 and 46 and the terminal electrode 15 are electrically connected to each other via the pad conductors 51, 53, and 55 and a through-hole conductor 37. Therefore, each of the capacitors C1, C2, C3, and C4 is connected to the terminal electrode 15. The through-hole conductor 37 penetrates through the insulator layers 3, 5, 7, and 9 placed between the internal electrode 46 and the terminal electrode 15.

Each of the pad conductors 51, 53, and 55 and the through-hole conductors 31, 32, and 37 includes an electrical conducting material. The electrical conducting material includes, for example, Ag or Pd. Each of the pad conductors 51, 53, and 55 and the through-hole conductors 31, 32, and 37 includes a sintered body of a conductive paste including a conductive material. The conductive material is, for example, Ag powder or Pd powder. The through-hole conductors 31, 32, and 37 are formed by sintering of a conductive paste filled in through-holes formed in ceramic green sheets to configure the corresponding insulator layers 3, 5, 7, and 9.

As illustrated in FIG. 8, the filter array FA1 includes a filter F1 and a filter F2. The filter F1 includes the inductor L1 and the capacitors C1 and C2. The filter F2 includes the inductor L2 and the capacitors C3 and C4. Each of the filters F1 and F2 configures a π-filter. The filter array FA1 includes two π-filters. Each of the inductors L1 and L2 is disposed in the function portion 2b. Each of the capacitors C1, C2, C3, and C4 is disposed in the function portion 2a. In the filter array FA1, a potential of the terminal electrode 11 and that of the terminal electrode 13 are different, and a potential of the terminal electrode 12 and that of the terminal electrode 14 are different. For example, in a case in which the inductor L1 constitutes a first inductor, the inductor L2 constitutes a second inductor. For example, in a case in which each of the capacitors C1 and C2 constitutes a first capacitor, each of the capacitors C3 and C4 constitutes a second capacitor.

As illustrated in FIG. 1 and FIG. 2, the filter array FA1 includes insulating layers ISa and ISb. The insulating layers ISa and ISb are disposed on the element body 1. The insulating layer ISa is formed on the first side surface 1c. The insulating layer ISb is formed on the second side surface 1d. In the present embodiment, the filter array FA1 includes the two insulating layers ISa and ISb. The first principal surface 1a, the second principal surface 1b, the third side surface 1e, and the fourth side surface 1f are exposed from the insulating layers ISa and ISb. Each of the insulating layers ISa and ISb includes an electrical insulating material. The electrical insulating material is, for example, insulating glass. The insulating glass is, for example, Sr—Al—Si—B—O-based glass, Ba—Al—Si—B—O-based glass, or Si—Ba—Li—O-based glass. Each of the insulating layers ISa and ISb may include an insulating resin.

The insulating layer ISa is formed on the first side surface 1c in such a manner as to be in contact with at least a region $2c_1$ exposed from the electrode portions 11c and 13c between the electrode portions 11c and 13c in the surface of the intermediate portion 2c. In the present embodiment, the insulating layer ISa is formed on the whole first side surface 1c in such a manner as to be in contact with the electrode portions 11c and 13c, and a region exposed from the electrode portions 11c and 13c in the surfaces of the function portion 2a, the function portion 2b, and the intermediate portion 2c. The insulating layer ISa is formed in such a manner as to be in contact with the first electrode layer E1 of each of the electrode portions 11c and 13c. The insulating layer ISa is formed on the first side surface 1c across the region $2c_1$ in the surface of the intermediate portion 2c.

The insulating layer ISb is formed on the second side surface 1d in such a manner as to be in contact with at least a region $2c_2$ exposed from the electrode portions 12c and 14c between the electrode portions 12c and 14c in the surface of the intermediate portion 2c. In the present embodiment, the insulating layer ISb is formed on the whole second side surface 1d in such a manner as to be in contact with the electrode portions 12c and 14c, and a region exposed from the electrode portions 12c and 14c in the surfaces of the function portion 2a, the function portion 2b, and the intermediate portion 2c. The insulating layer ISb is formed in such a manner as to be in contact with the first electrode layer E1 of each of the electrode portions 12c and 14c. The insulating layer ISb is formed on the second side surface 1d across the region $2c_2$ in the surface of the intermediate portion 2c.

As described above, in the present embodiment, the insulating layer ISa formed on the first side surface 1c is in contact with the region exposed from the electrode portions 11c and 13c between the electrode portions 11c and 13c in the surface of the intermediate portion 2c. The insulating layer ISb formed on the second side surface 1d is in contact with the region exposed from the electrode portions 12c and 14c between the electrode portions 12c and 14c in the surface of the intermediate portion 2c. Therefore, in the filter array FA1, migration tends not to occur through the intermediate portion 2c. Consequently, the filter array FA1 controls generation of migration.

In the filter array FA1, the insulating layer ISa is formed on the whole first side surface 1c in such a manner as to be in contact with the electrode portions 11c and 13c, and the region exposed from the electrode portions 11c and 13c in the surfaces of the function portion 2a, the function portion 2b, and the intermediate portion 2c. The insulating layer ISb is formed on the whole second side surface 1d in such a manner as to be in contact with the electrode portions 12c and 14c, and the region exposed from the electrode portions 12c and 14c in the surfaces of the function portion 2a, the function portion 2b, and the intermediate portion 2c. Therefore, the filter array FA1 reliably controls generation of migration.

The insulating layer ISa may be formed on the first side surface 1c in such a manner as to be in contact only with the region exposed from the electrode portions 11c and 13c between the electrode portions 11c and 13c in the surface of the intermediate portion 2c. However, in a case in which the insulating layer ISa is formed on the whole first side surface 1c, the filter array FA1 reliably controls generation of migration, as described above. The insulating layer ISb may be formed on the second side surface 1d in such a manner as to be in contact with the region exposed from the electrode portions 12c and 14c between the electrode portions 12c and 14c in the surface of the intermediate portion 2c. However, in a case in which the insulating layer ISb is formed on the whole second side surface 1d, the filter array FA1 reliably controls generation of migration, as described above.

The connecting portion 21a of the coil conductor 21 and the connecting portion 41b of the internal electrodes 41 are connected to the first electrode layer E1 of the electrode portion 11c. The connecting portion 23a of the coil conductor 23 and the connecting portion 43b of the internal electrodes 43 are connected to the first electrode layer E1 of the electrode portion 13c. The connecting portion 22a of the coil conductor 22 and the connecting portion 42b of the internal electrodes 42 are connected to the first electrode layer E1 of the electrode portion 12c. The connecting portion 24a of the coil conductor 24 and the connecting portion 44b of the internal electrodes 44 are connected to the first electrode layer E1 of the electrode portion 14c. In a case in which a position in which the first electrode layer E1 is formed is deviated from an intended position, a corresponding connecting portion 21a, 22a, 23a, or 24a and a corresponding connecting portion 41b, 42b, 43b, or 44b may be exposed from the first electrode layer E1. In a case in which the corresponding connecting portion 21a, 22a, 23a, or 24a and the corresponding connecting portion 41b, 42b, 43b, or 44b are exposed from the first electrode layer E1, moisture may infiltrate into a space between the connecting portion 21a, 22a, 23a, or 24a and the connecting portion 41b, 42b, 43b, or 44b, and the element body 1. For example, a plating solution may infiltrate into the element body 1.

In the filter array FA1, the insulating layer ISa is formed in such a manner as to be in contact with the first electrode layer E1 of each of the electrode portions 11c and 13c. The insulating layer ISb is formed in such a manner as to be in contact with the first electrode layer E1 of each of the electrode portions 12c and 14c. Therefore, the insulating layers ISa and ISb control infiltration of moisture into the element body 1.

In the filter array FA1, each of the insulating layers ISa and ISb includes insulating glass. Therefore, in this case, the filter array FA1 easily controls occurrence of migration. The insulating glass generally has erosion resistance to a plating solution. Therefore, when the second electrode layer E2 and the third electrode layer E3 are formed, the insulating layers ISa and ISb tend not to be eroded by the plating solution.

In the filter array FA1, insulation resistance of the intermediate portion 2c is lower than insulation resistance of each of the function portions 2a and 2b. In a case in which the insulation resistance of the intermediate portion 2c is lower than the insulation resistance of each of the function portions 2a and 2b, migration tends to occur. However, even in this case, the filter array FA1 controls occurrence of migration between the electrode portions 11c and 13c and between the electrode portions 12c and 14c.

In the filter array FA1, the terminal electrode 11 and the terminal electrode 13 have a potential difference, and the terminal electrode 12 and the terminal electrode 14 have a potential difference. In a case in which the terminal electrode 11 and the terminal electrode 13 have a potential difference, migration tends to occur between the electrode portions 11c and 13c. In a case in which the terminal electrode 12 and the terminal electrode 14 have a potential difference, migration tends to occur between the electrode portions 12c and 14c. Even in this case, the filter array FA1 controls occurrence of migration between the electrode portions 11c and 13c and between the electrode portions 12c and 14c.

As illustrated in FIG. 8, the filter array FA1 includes the filter F1 including the inductor L1 and the capacitors C1 and C2, and the filter F2 including the inductor L2 and the capacitors C3 and C4. Each of the filters F1 and F2 configures a π-filter. The filter array FA1 includes two π-filters. The present embodiment achieves an LC filter array that controls occurrence of migration.

Figure 9:
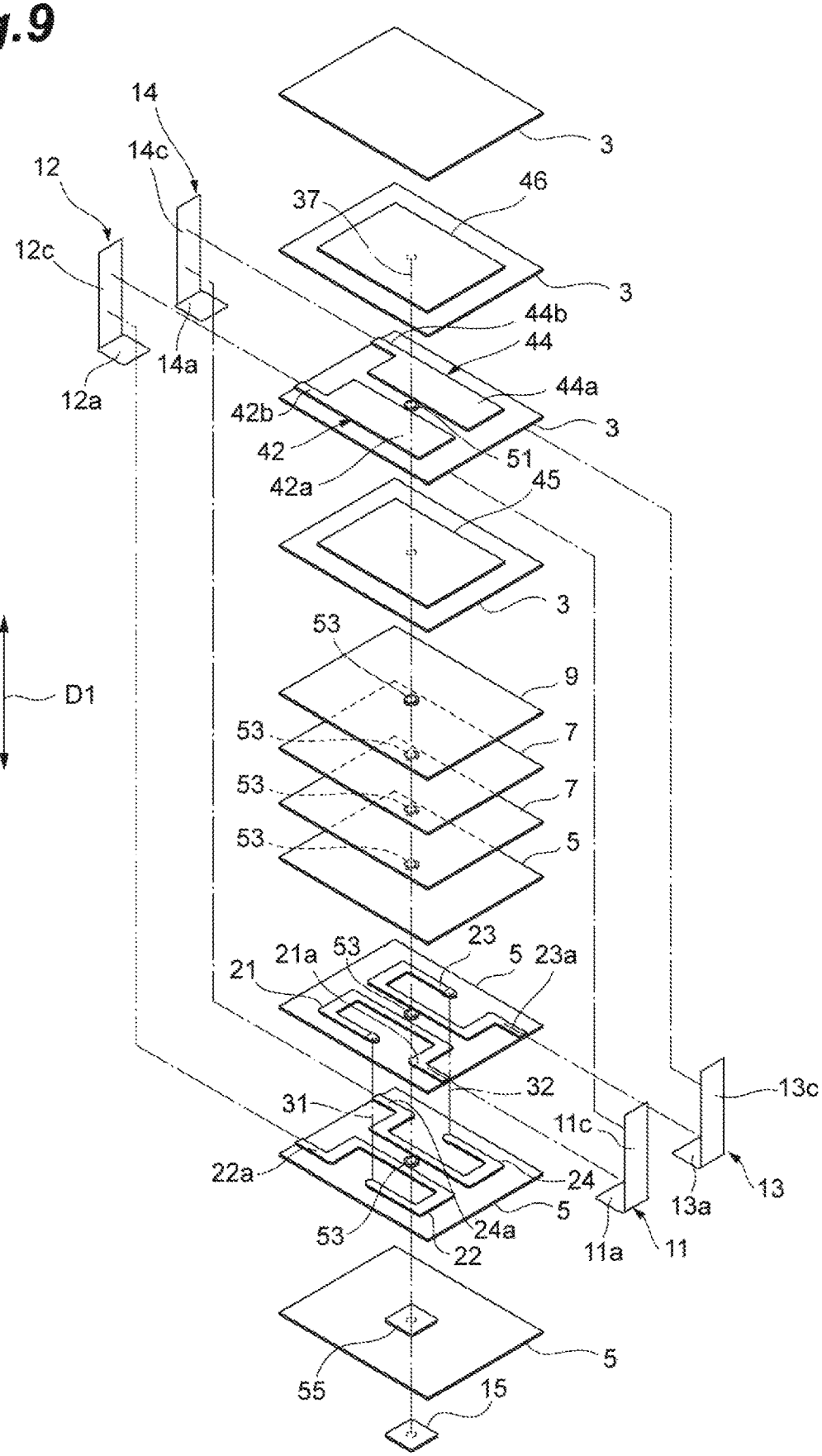
FIG. 9 is an exploded perspective view illustrating a configuration of a multilayer LC filter array according to a modification of the embodiment.
Figure 10:
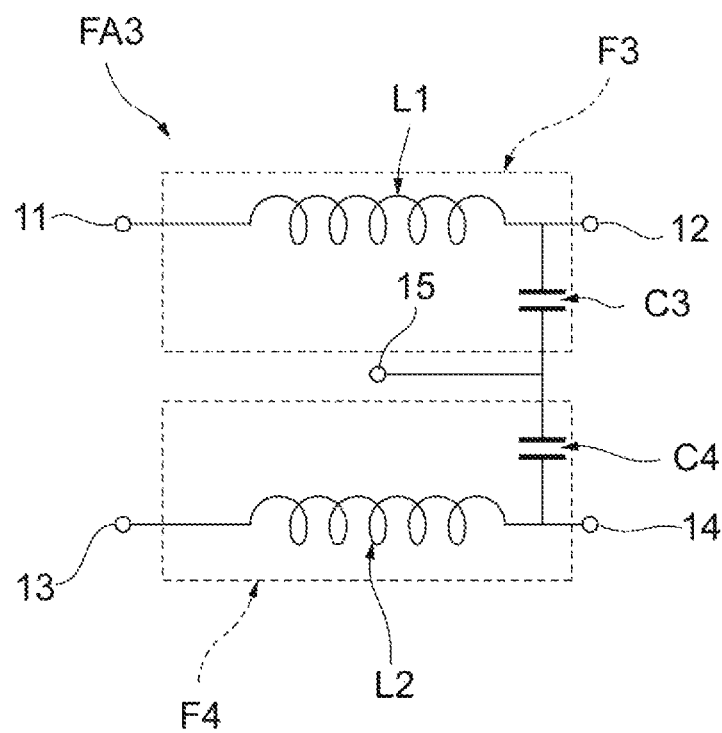
FIG. 10 is a view illustrating an equivalent circuit of the multilayer LC filter array according to the modification of the embodiment.

Next, a configuration of a multilayer LC filter array according to a modification of the present embodiment will be described with reference to FIG. 9 and FIG. 10. FIG. 9 is an exploded perspective view illustrating a configuration of the multilayer LC filter array according to the modification. FIG. 10 is a view illustrating an equivalent circuit of the multilayer LC filter array according to the modification. Hereinafter, differences between the filter array FA1 and the multilayer LC filter array according to the modification will be mainly described.

Although not illustrated, the multilayer LC filter array according to the present modification includes the element body 1, the terminal electrodes 11, 12, 13, 14, and 15, and the insulating layers ISa and ISb similarly to the filter array FA1 according to the above-described embodiment.

As illustrated in FIG. 9, the multilayer LC filter array according to the present modification includes the plurality of coil conductors 21, 22, 23, and 24, and the plurality of internal electrodes 42, 44, 45, and 46. The internal electrode 42 is placed closer to a third side surface 1e. The internal electrode 44 is placed closer to a fourth side surface 1f. As illustrated in FIG. 10, the multilayer LC filter array according to the present modification includes a filter F3 including the inductor L1 and the capacitor C2, and a filter F4 including the inductor L2 and the capacitor C4. Each of the filters F3 and F4 configures an L-filter. That is, the multilayer LC filter array includes the two L-filters.

The multilayer LC filter array according to the present modification also controls occurrence of migration similarly to the filter array FA1.

Although the embodiments and modifications of the present invention have been described above, the present invention is not necessarily limited to the embodiments and modifications, and the embodiment can be variously changed without departing from the scope of the invention.

For example, the number of coil conductors 21, 22, 23, and 24 included in each of inductors L1 and L2 is not limited to "2" and may be greater than or equal to "3." For example, the number (number of lamination) of internal electrodes 41, 42, 43, 44, 45, and 46 included in each of capacitors C1, C2, C3, and C4 is not limited to "3" and may be greater than or equal to "4."

An electronic component of the present embodiment is the multilayer LC filter array FA1. Applicable electronic components are not limited to the multilayer LC filter array. The applicable electronic components include, but not limited to, a composite electronic component including a varistor and an inductor, a composite electronic component including a resistor and an inductor, and an electronic component such as a multilayer common-mode filter.

What is claimed is:

1. An electronic component comprising:
   an element body including:
      a first function portion including a magnetic material;
      a second function portion including a dielectric material;
      an intermediate portion that includes: a first component included in the magnetic material, and a second component included in the dielectric material and different from the first component, the intermediate portion being placed between the first function portion and the second function portion; and
      a side surface including surfaces of the first function portion, the second function portion, and the intermediate portion;
   a circuit element disposed in the element body, the circuit element including a first internal conductor disposed in the first function portion and a second internal conductor disposed in the second function portion;
   a plurality of terminal electrodes disposed on the element body, each of the plurality of terminal electrodes including an electrode portion disposed on the side surface across the surfaces of the first function portion, the second function portion, and the intermediate portion; and
   an insulating layer disposed on the element body, the insulating layer being disposed on the side surface so as to be in contact with a region of the surface of the intermediate portion that is between the electrode portions of the plurality of terminal electrodes.

2. The electronic component according to claim 1, wherein the insulating layer is disposed on a whole of the side surface so as to be in contact with regions of the surfaces of the first function portion and the second function portion that are between the electrode portions of the plurality of terminal electrodes.

3. The electronic component according to claim 2,
   wherein each of the electrode portions of the plurality of terminal electrodes includes a sintered metal layer disposed on the side surface, and
   the insulating layer is in contact with the sintered metal layers.

4. The electronic component according to claim 1, wherein the insulating layer includes insulating glass.

5. The electronic component according to claim 1, wherein an insulation resistance of the intermediate portion is lower than an insulation resistance of each of the first function portion and the second function portion.

6. The electronic component according to claim 1, wherein the plurality of terminal electrodes is configured to have a potential difference.

7. The electronic component according to claim 1, further comprising:
- a first inductor and a second inductor disposed in the first function portion;
- a first capacitor disposed in the second function portion and that configures a filter with the first inductor; and
- a second capacitor disposed in the second function portion and that configures a filter with the second inductor,
- wherein the magnetic material includes a ferrite material, and the dielectric material includes a dielectric ceramic material, and
- the plurality of terminal electrodes includes a first input terminal electrode and a first output terminal electrode to which the first inductor is connected, and a second input terminal electrode and a second output terminal electrode to which the second inductor is connected.

8. An electronic component comprising:
an element body including:
- a first function portion including a first material;
- a second function portion including a second material;
- an intermediate portion that includes: a first component included in the first material, and a second component included in the second material and different from the first component, the intermediate portion being placed between the first function portion and the second function portion; and
- a side surface including surfaces of the first function portion, the second function portion, and the intermediate portion;
a plurality of terminal electrodes disposed on the element body, each of the plurality of terminal electrodes including an electrode portion disposed on the side surface across the surfaces of the first function portion, the second function portion, and the intermediate portion; and
an insulating layer disposed on the element body, the insulating layer being disposed on the side surface so as to be in contact with a region of the surface of the intermediate portion that is between the electrode portions of the plurality of terminal electrodes,
wherein an insulation resistance of the intermediate portion is lower than an insulation resistance of each of the first function portion and the second function portion.

\* \* \* \* \*